United States Patent [19]

Kruit

[11] Patent Number: 4,882,486
[45] Date of Patent: Nov. 21, 1989

[54] ELECTRON DETECTION WITH ENERGY DISCRIMINATION

[75] Inventor: Pieter Kruit, Delft, Netherlands

[73] Assignee: U.S. Philips Corporation, New York, N.Y.

[21] Appl. No.: 342,704

[22] Filed: Apr. 21, 1989

Related U.S. Application Data

[63] Continuation of Ser. No. 85,997, Aug. 14, 1987, abandoned.

[30] Foreign Application Priority Data

Aug. 27, 1986 [NL] Netherlands .................. 8602177

[51] Int. Cl.⁴ .................................... H01J 37/05
[52] U.S. Cl. .............................. 250/305; 250/310; 250/306; 250/396 ML; 250/397
[58] Field of Search ........ 250/305, 306, 310, 396 ML, 250/396 R, 397

[56] References Cited

U.S. PATENT DOCUMENTS

| | | | |
|---|---|---|---|
| 3,474,245 | 6/1966 | Kimura et al. | 250/397 |
| 4,464,571 | 8/1984 | Plies | 250/305 |
| 4,540,885 | 9/1985 | Plies et al. | 250/305 |
| 4,658,137 | 4/1987 | Garth et al. | 250/305 |
| 4,728,790 | 3/1988 | Plies | 250/305 |

FOREIGN PATENT DOCUMENTS 2183898 6/1987 United Kingdom ............... 250/306

OTHER PUBLICATIONS

Garth S. L. J. et al., "Magnetic Field Extraction of Secondary Electrons For Accurate Integrated Circuit Voltage Measurement", Journal Vac. Science Tech., B4, No. 1, Jan.-Feb., 1986, pp. 217-220.

Pfeiffer, H. C. etal., "Advanced Deflection Concept for Large Area, High Resolution E-Beam Lighothgraphy", Journ. Vac. Sci. Techn., 19(4), Nov.-Dec., 1981.

*Primary Examiner*—Carolyn E. Fields
*Assistant Examiner*—John A. Miller
*Attorney, Agent, or Firm*—Paul R. Miller

[57] ABSTRACT

By using an electrostatic magnetic dispersing field adapted for that purpose in a measuring space in an electron microscope it is possible to detect substantially all the electrons liberated by a primary beam from a surface of an object to be examined in which the measuring field can be increased without any error by using a variable axis lens system at the area. Auger electrons can be detected selectively by an adapted field strength variation of the magnetic field and superposition of an electrostatic braking field. A magnetic lens for generating the magnetic field may also be used with only small adaptations as an objective lens for the electron microscope.

29 Claims, 2 Drawing Sheets

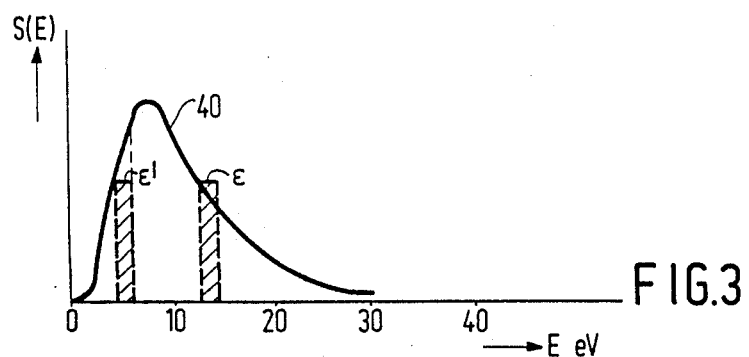
FIG.3
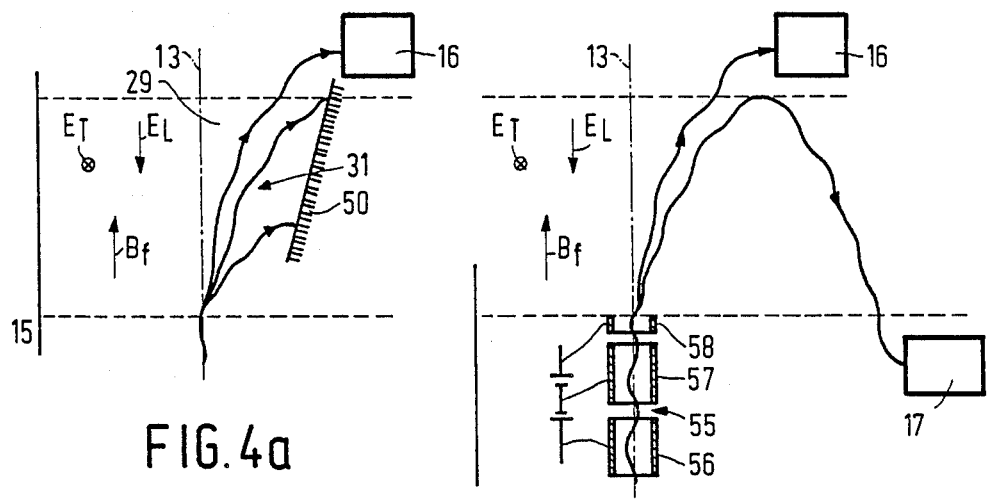
FIG.4a
FIG.4b
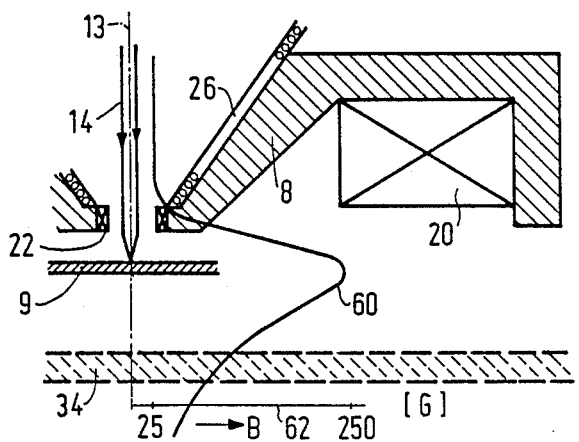
FIG.5

ELECTRON DETECTION WITH ENERGY DISCRIMINATION

This is a continuation of application Ser. No. 085,997, filed Aug. 14, 1987. Now abandoned.

The invention relates to an apparatus for the detection of electrons originating from a surface of an object to be examined which is placed in a measuring space in which a magnetic field is generated to make the electrons to be detected to move parallel.

Such an apparatus is known from the article "Magnetic field extraction of secondary electrons for accurate integrated circuit voltage measurement", published in Journal Vac. Science Techn. B4, No. 1, Jan-Feb. 1986, pp 217–220 by S. C. J. Garth and W. C. Nixon; hereinafter referred to as the Garth article.

An apparatus described in this article for testing chips comprises a scanning electron microscope having a retarding field energy analyser between an objective lens and a chip to be examined and a magnetic singlepole lens (snorkel lens) as a result of which local crosstalk effects of the chip surface disturbing the measurements are reduced and electrons emanating from the chip surface are parallelized.

Disadvantages of the known apparatus are that the snorkel lens can be effected only for axially extending beams, while for off-axis beams the lens is turned off substantially or entirely, as a result of which either the field of view is considerably restricted or the off-axis measurements become inaccurate. Since measurements are carried out after a selecting retarding field, a less sharp edge of the energy spectrum of the electrons is relevant which restricts the measuring accuracy or the measuring speed. Furthermore, the known measuring method does not permit normalization on the overall current as a result of which fluctuations in the primary electron beam, the secondary emission coefficient and the like can adversely influence the measuring accuracy.

It is required of such a device that, with a primary energy of approximately 1 KeV and a primary current of approximately $10^{-8}$A, an electron spot of approximately 0.1 $\mu$m on the object to be examined can be realized. A field of view of at least 1 mm$^2$, an energy separating power of at most 10 meV, a small track cross-talk and restricted spot movement on the chip in voltage scanning is desired when the electrostatic field is low.

It is the object of the invention to avoid these disadvantages and to optimally satisfy the requirements imposed. For that purpose, a device of the type mentioned in the opening paragraph is characterized according to the invention in that the apparatus comprises an energy-sensitive detection system and an electron-optical system for generating a combined electrostatic and magnetic field with a spacially dispersive effect for selective detection of electrons within an adjustable energy range within the energy range of the return electron beam originating from the surface of the object to be examined.

The whole spectrum of the electrons emanating from the object can be measured by means of an apparatus according to the invention, as a result of which there can be directly standardized on the overall current, the best suitable steep edge of the distribution can be chosen for measuring energy shifts and the signal-to-noise ratio of the measuring signal can be considerably improved.

In a further preferred embodiment the electron-optical system comprises means for generating a magnetic transverse field at the area of the dispersive magnetic field proportional to the axial strength variation of the dispersive magnetic field. As a result of this the magnetic optical axis of the lens field can be shifted with respect to a mechanical axis thereof. In particular a variable lens axis system has been used for this purpose, for example, as described in the article "Advanced deflection concept for large area, high resolution e-beam lithography", published in Journ. Vac. Sci. Technol. 19(4) Nov.-Dec. 1981 by H. C. Pfeiffer and G. O. Langer, specially for use in an electron beam writing machine for realizing a large field with perpendicular landing without object movement. In such a lens system a marked reduction of, for example, chromatic errors can be realized as a result of which the electron measurement can be optimal over a comparatively large field.

In a preferred embodiment an electrostatic field delaying the electrons is applied which is transparent only for electrons above a given energy. As a result of this an energy range on the high energy side of the spectrum can be measured, although still again energy-dependent. The boundary may be chosen to be so that specific electrons which are liberated from the surface or reflected thereat according to a given process are measured. For use of the invention in an electron microscope it may be favourable to design the electron-optical system in such a manner that the magnetic part thereof is also suitable to serve as an objective lens for the electron microscope. As a result of this a compact and efficient apparatus can be designed.

In a further preferred embodiment the detection system comprises at least two simultaneously operating channels a first of which is accommodated to measure electrons with an energy above a given value and a second of which is designed to measure electrons with an energy below this value. As a result of this the whole spectrum can be measured with the already mentioned advantages thereof without a complicated detection system being necessary. The whole spectrum can also be measured with a linear detector array having many channels as a result of which a direct measurement of the spectrum as a whole is obtained. However, as a result of this the detection becomes more sensitive to electron-optical and geometrical aberrations in the apparatus and the signal processing becomes comparatively complicated and time-consuming. It should be borne in mind that for many applications the detection system is in the dispersing magnetic field. For measurement, for example, of Auger electrons to be liberated from an object a location-sensitive detection array may be a suitable solution. For Auger spectrometry an electrostatic field between the emanating surface and the detection system may also be used such that one of the detection channels can be reached only by electrons having an energy level imposed by the Auger process of emanating from the surface. The electrons having an energy larger than this energy can then be measured, for example, by means of a second detection channel.

A few preferred embodiments according to the invention will be described hereinafter in greater detail with reference to the drawings, in which:

FIG. 3 shows an example of an energy spectrum of electrons to be detected,

FIGS. 4a and 4b show two examples of energy-analysing systems for, for example, Auger electrons, and FIG. 5 shows a lens system which can also be used as an objective lens.

Figure 1:
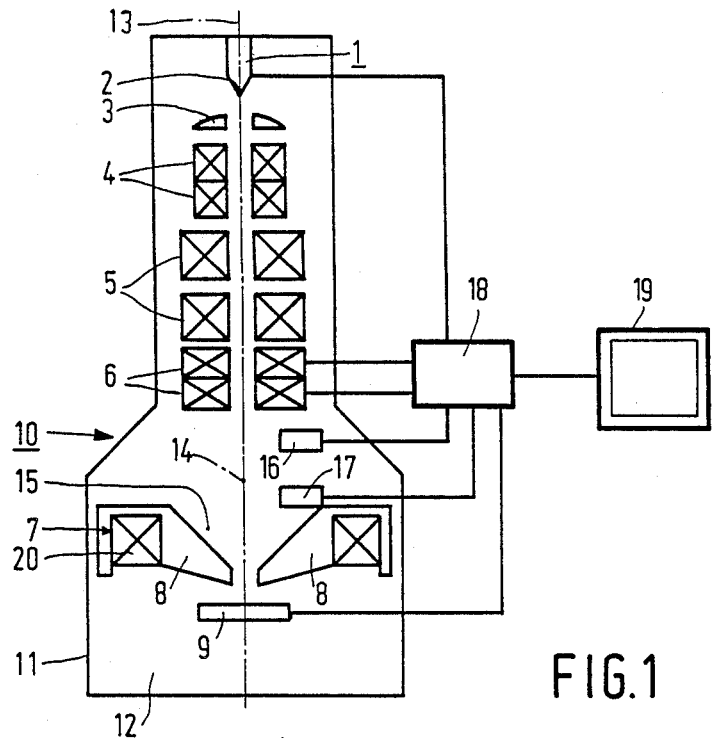
FIG. 1 shows very diagrammatically an apparatus according to the invention.

An apparatus shown diagrammatically in FIG. 1 comprises, largely in accordance with a scanning electron microscope, an electron source 1, for example with an LaB6 or a semiconductor electron emitter 2, an anode 3, a beam-directing system 4, a condensor lens 5, a beam scanning system 6 and a final lens system 7 with pole shoes 8. All these elements together with an object 9 to be examined are incorporated in a housing 10 having a vacuum wall 11. The housing furthermore comprises an object space 12 in which an object-moving mechanism which can be adjusted from the outside and is not further shown may be incorporated. For the detection of electrons emanating from the object surface by radiation with an electron beam 14 extending along a main axis 13, a first detector 16 and a second detector 17 are accommodated in a measuring space 15. The scanning coils, the electron source, the object-movement mechanism and the detectors are connected to a central control device 18 to which a television monitor 19 is connected for image or spectrum display but to which, for example, a digital signal-processing system, a hard copy unit and a writing device may also be connected. The detectors may also be connected directly to a signal-processing system to which again each of the elements may be connected.

Figure 2:
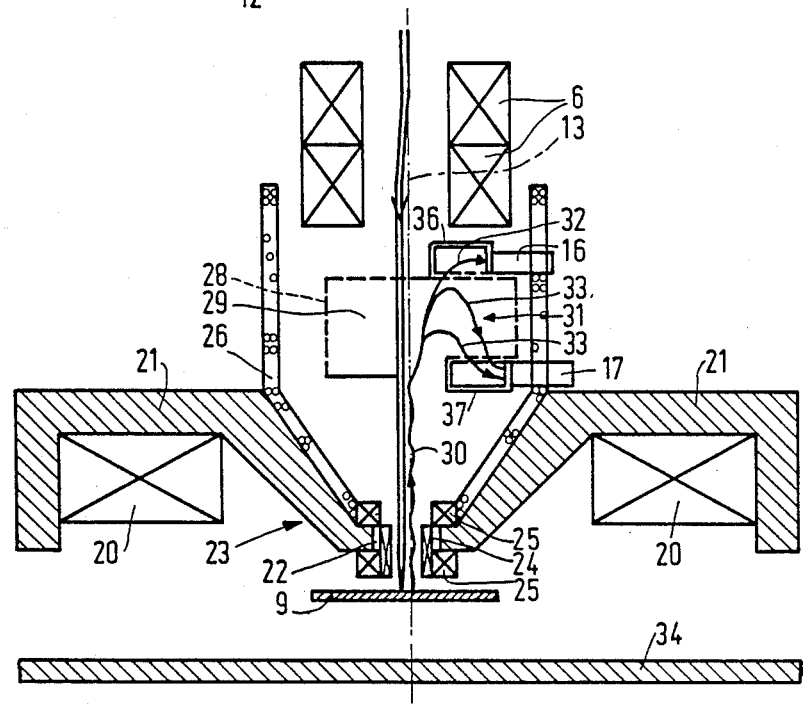
FIG. 2 shows an embodiment of a lens optical system therefore.

FIG. 2 shows diagrammatically an example of a final lens system, in this case in particular for a chip inspection apparatus. A lens coil 20, largely enclosed by a yoke 21 which, near the main axis 13 of the electron-optical system, terminates in a pole shoe 22, part of a single pole piece lens 23, which optionally may be sealed by means of a ferro-magnetic plate 34. A coil 24 to move the optical axis is incorporated near the pole shoe 22 arranged around the optical axis 13 and a system of coils 25 for dynamic focusing and a stigmator, not shown, may be incorporated. Also arranged around the optical axis is an extra coil 26 for generating a magnetic deflection field in the measuring space 15. By means of an electron-optical system 28 of which the coil 26 forms part, an energy-separating braking field 29 may be generated in the measuring space in combination with the dispersive field, as a result of which electrons from an electron beam 30 originating from the object are spread into a fan 31 of electron paths in an energy-dependent manner. Faster electrons 32 therefrom are captured by the detector 16 and slower electrons 33 by the detector 17. The detectors are screened from interfering electrons by means of screening caps 36 and 37. It is to be noted that the whole return beam 30 is now measured and not only a part above a given energy level as is done in conventional apparatus and that the detector efficiency is substantially 100%. The advantage thereof may be illustrated with reference to a spectrum shown in FIG. 3 in which the number of electrons to be detected or the electron current are plotted along the vertical axis and the electron energy, for example in eV, is plotted along the horizontal axis. It may be read from FIG. 3 that again a shift of the energy spectrum over a distance $\epsilon$, for example, caused by a potential excursion over a chip surface to be measured, is measured in existing apparatus by detection of a comparatively small number of electrons with shift $\epsilon$ along the energy axis of the curve 40 with a static noise contribution of all electrons under the curve 40 of higher energy, the signal-to-noise ratio in the detection signal being comparatively poor. The signal-to-noise ratio in an apparatus according to the invention is significantly more favourable because upon detection of a number of electrons which in principle is approximately equal under $\epsilon'$ only the statistical noise of the small number of electrons of a higher energy under the curve 40. Since substantially all the electrons from the return beam are measured, they can easily be corrected for variation in the overall current.

For scanning of the object, known scanning methods may in principle be used but the disadvantages occur that electrons which are liberated beyond the optical axis are deflected still further away from the optical axis by the diverging lens field and are distributed by the scanning field as a result of which especially energy-dependent measurements are disturbed and off-axis electrons can be focused with difficulty only as a result of which again errors in the measured signals occur. An improvement herein can be obtained by using the moving objective (MOL-lens) known per se or the variable axis immersion lens (VAIL-lens). Such a lens, for example, the VAIL-lens, forms a deflection field in a space where the objective lens field still shows a comparatively strong gradient. The axis of the lens system is thus shifted electron-optically. A beam incident parallel to the displaced axis is thus always focused on the now coincident axis. When the generated transverse field of the VAIL-lens is equal to the transverse field of the lens at the area, a flux line is formed which always extends exactly along the displaced axis. Electrons emerging from the surface at the area then travel along the local flux line away from the surface in agreement with the axial electrons. If in this set-up problems are experienced, for example, by image defects or achromatic deflection errors, the primary beam may also be made to coincide sooner with the displaced optical axis. For this purpose a beam deflection mechanism may be used in the electron optical system between the source and the final lens. If necessary, such a deflection system may be combined with dynamic focusing elements and stigmators.

Although the electrons to be measured now enter the measuring space while being optimally directed, the displacement thereof with respect to the real optical axis may still have an adverse influence on energy-dependent measurements. A solution to this can be found by making the deflection field in fact too strong but causing the primary beam to be incident at an angle in compensation thereof. The return beam is then directed towards the real optical axis and the influence in the measurements is avoided. For shooting the primary beam at an angle a scanning system in double construction may be used so that a kind of beam alignment can be realized. For re-deflection of the return beam an extra coil system may also be used. For this deflection the primary beam must then be precompensated.

For measuring an electron current from the return beam 30 of selective electrons within a given energy range, for example, an energy between $E_o-\Delta E$ and $E_o$, a delaying electrostatic field may be generated in an apparatus according to the invention in the detection side of the measuring space 15. As a result of this a signal can be recorded by the first detector 16 of only electrons in the energy range.

FIG. 4a shows diagrammatically a system in which electrons within an adjustable energy range can be captured by a composite detector 50 and electrons having an energy higher than this range by the detector 16. Since the field 29 influences the energy of the electrons from the return beam in a spacially dispersing manner the location-sensitive detector 50 in this case is an energy discriminating detector. The dispersing fields in FIG. 4a are indicated by a magnetic field $B_f$, a transverse electro-static field $E_t$ and the delaying electro-static field is indicated by $E_L$ which thus is directed parallel but opposite to the magnetic field $B_f$. Apart from the spiraling of the electrons about the flux lines the electron paths in the fan beam 31 now are parabolas which terminate in the detector inputs. If space construction of the apparatus results in restrictions which adversely influence the detection of, for example, the selectively directed electrons, this can at least partly be compensated for by adapting the direction of the magnetic field $B_f$ thereto.

A further embodiment for measuriing, for example, Auger electrons originating from the object is shown in FIG. 4b with again the fields $E_t$, $B_f$ and $E_L$, the first detector 16 and the second detector 17. The return beam now passes first through an electrostatic lens system 55 as result of which only electrons having an energy between $E_o - \Delta E$ and $E_o$ can reach the second detector 17. Electrons having an energy exceeding $E_o$ are recorded by the detector 16. Advantages of this solution over than of FIG. 4a is that a simpler signal is obtained and that comparatively complicated composite detector 50 is omitted. The lens system 55 comprises in fact a unipotential lens having two electrodes 56 and 58 at a first potential and an intermediate electrode 57 at a potential which differs therefrom, and in this case is lower, or may be constructed as a standard retarding field analyser with grids.

FIG. 5 shows diagrammatically an example of a lens system according to the invention which may also serve as an objective lens. This lens system again comprises the coil 20 with the yoke 8, the pole shoe 22, and the extra coil 26. Furthermore shown in the drawing are the incident electron beam 14, the object 9 and the ferromagnetic sealing plate 34. A curve 60 for the lens indicates the magnetic field strength for which purpose a horizontal axis 62 with magnetic field strength values in Gauss is given. All the advantages as described in the Garth article can be realized by means of this lens. As major advantages of such a lens may be mentioned the strong reduction by local field excursion on the object, the small focal distance with the great current density realized thereby on the object surface and the parallelizing action on the electrons in the return beam.

With reference to the magnetic field in the lens system an optimization can be achieved by a favourable compromise between, on the one hand, a strong field at the area of the detector as a condition for an adiabatic electron movement with reduction of the influence of interference fields and of the focus movement on the energy determination at the area, and on the otherhand, a not too high magnetic field strength because thereby the angular aperture for detection is reduced and because $\int Bdz$ must remain restricted on behalf of the primary beam. A ratio of 1 to 10 between magnetic field strength at the entrance of the electrons to be detected and the magnetic field strength at the detector input seems to be a favourable compromise, which with a pole shoe diameter of 15 mm and a focal distance of 7 mm results in magnetic field strength values of 25 Gauss and 250 Gauss as indicated in FIG. 5. By causing the diverging magnetic field to extend up to the object surface an even more favourable ratio can be realized.

What is claimed is:

1. An apparatus for detecting electrons originating from a surface of an object being examined comprising
   a measuring space having means for holding the object,
   first means for directing an electron beam along an optical axis onto a surface of said object,
   electron-optical system means for generating a combined electrostatic and magnetic field in said measuring space, said combined field providing a spatially dispersive effect in an energy range for electrons of a return electron beam originating from said surface, and
   energy sensitive detection system means having two separated detectors for selectively detecting an entire spectrum of said electrons of said return beam within said energy range wherein each of said detectors detects a separate range of energies of said spectrum.

2. An apparatus according to claim 1, wherein said electron-optical system means includes magnetic coil means for generating a transverse magnetic field in said measuring space, said transverse magnetic field coinciding with at least a greater part of said dispersive effect for the magnetic portion of said combined field.

3. An apparatus according to claim 1 or claim 2, wherein the magnetic field of said combined field in said measuring space is significantly stronger at the area of said surface than farther away from said surface.

4. An apparatus according to claim 3, wherein said electron-optical system means includes magnetic lens means having a single pole for generating the magnetic field of said combined field in said measuring space, said magnetic lens means being disposed between said measuring space and said two separated detectors.

5. An apparatus according to claim 3, wherein said magnetic lens means having said single pole is an electron microscope objective lens.

6. An apparatus according to claim 4, wherein said electron optical system means provides an energy separating retarding field in said measuring space in combination with said dispersive effect for said magnetic portion of said combined field.

7. An apparatus according to claim 6, wherein said two separated detectors includes a first detector for detecting return electrons with an energy exceeding an adjustable value within said energy range, and a second detector for detecting electrons with a lower energy within said energy range.

8. An apparatus according to claim 7, wherein said energy sensitive detection system means detects substantially all of said electrons of said return beam.

9. An apparatus according to claim 6, wherein said dispersive effect for the magnetic portion of said combined field first decreases slowly from said surface to an intermediate value and then decreases rapidly to zero, said electrons of said return beam then having a reduction in angle with said optical axis upon traversing said measuring space.

10. An apparatus according to claim 9, wherein said magnetic portion of said combined field serves as a lens field for an electron microscope objective lens field.

11. An apparatus according to claim 10, wherein the electron microscope has a beam scanning mechanism specifically designed for detection of Auger electrons from said electrons of said return beam.

12. An apparatus according to claim 4, wherein said two separated detectors includes a first detector for detecting return electrons with an energy exceeding an adjustable value within said energy range, and a second detector for detecting electrons with a lower energy within said energy range.

13. An apparatus according to claim 12, wherein said energy sensitive detection system means detects substantially all of said electrons of said return beam.

14. An apparatus according to claim 4, wherein said combined electrostatic and magnetic field in said measuring space includes a retarding electrostatic field directed parallel but to the opposite magnetic field of said combined field, said retarding electrostatic field being only transparent to electrons having an energy exceeding $E_o - \Delta E$, where $E_o - \Delta E$ is an energy exceeding an adjustable value within said energy range.

15. An apparatus according to claim 14, wherein said energy sensitive detection system means selectively detects electrons within an energy range between $E_o - \Delta E_o$ and $E_o$.

16. An apparatus according to claim 4, wherein said two separated detectors includes a linear location-sensitive detector for detecting at least a part of said electrons of said return beam.

17. An apparatus according to claim 4, wherein said dispersive effect for the magnetic portion of said combined field first decreases slowly from said surface to an intermediate value and then decreases rapidly to zero, said electrons of said return beam then having a reduction in angle with said optical axis upon traversing said measuring space.

18. An apparatus according to claim 17, wherein the magnetic field of said combined field serves as a lens field for an electron microscope objective lens field.

19. An apparatus according to claim 18, wherein the electron microscope has a beam scanning mechanism specifically designed for detection of Auger electrons from said electrons of said return beam.

20. An apparatus according to claim 1, wherein said two separated detectors includes a first detector for detecting return electrons with an energy exceeding an adjustable value within said energy range, and a second detector for detecting electrons with a lower energy within said energy range.

21. An apparatus according to claim 20, wherein said energy sensitive detection system means detects substantially all of said electrons of said return beam.

22. An apparatus according to claim 1, wherein said two separated detectors includes a linear location-sensitive detector for detecting at least a part of said electrons of said return beam.

23. An apparatus according to claim 1, wherein said combined electrostatic and magnetic field in said measuring space includes a retarding electrostatic field directed parallel but opposite to the magnetic field of said combined field, said retarding electrostatic field being only transparent to electrons having an energy exceeding $E_o - \Delta E$, where $E_o - \Delta E$ is an energy exceeding an adjustable value within said energy range.

24. An apparatus according to claim 23, wherein said energy sensitive detection system means selectively detects electrons within an energy range between $E_o - \Delta E_o$ and $E_o$.

25. An apparatus according to claim 1, wherein said dispersive effect for the magnetic portion of said combined field first decreases slowly from said surface to an intermediate value and then decreases slowly from said surface to an intermediate value and then decreases rapidly to zero, said electrons of said return beam then having a reduction in angle with said optical axis upon traversing said measuring space.

26. An apparatus according to claim 25, wherein said magnetic porton of said combined field serves as a lens field for an electron microscope objective lens field.

27. An apparatus according to claim 26, wherein the electron microscope has a beam scanning mechanism specifically designed for detection of Auger electrons from said electrons of said return beam.

28. An apparatus according to claim 1, wherein said magnetic portion of said combined field serves as a lens field for an electron microscope objective field lens.

29. An apparatus according to claim 28, wherein the electron microscope has a beam scanning mechanism specifically designed for detection of Auger electrons from said electrons of said return beam.

* * * * *